United States Patent [19]

Itoh et al.

[11] Patent Number: 4,640,888
[45] Date of Patent: Feb. 3, 1987

[54] ALIGNMENT MARK ON A SEMICONDUCTOR AND A METHOD OF FORMING THE SAME

[75] Inventors: Yoshio Itoh; Hiroshi Ohtsuka; Tadashi Nishimuro; Norio Moriyama, all of Tokyo, Japan

[73] Assignee: Oki Electric Industry Co., Ltd., Japan

[21] Appl. No.: 691,977

[22] Filed: Jan. 17, 1985

Related U.S. Application Data

[62] Division of Ser. No. 619,960, Jun. 12, 1984, abandoned.

[30] Foreign Application Priority Data

Jun. 16, 1983 [JP] Japan ................................ 58-106646

[51] Int. Cl.[4] ............................ G03C 5/00; G03F 9/00
[52] U.S. Cl. ...................................... 430/323; 430/22; 430/324; 356/401

[58] Field of Search ................. 430/22, 323, 322, 311, 430/315, 5, 324; 356/401

[56] References Cited

U.S. PATENT DOCUMENTS 3,690,881  9/1972  King ................................... 430/5 X
4,343,878  8/1982  Chiang ................................... 430/5

Primary Examiner—John E. Kettle
Assistant Examiner—José G. Dees
Attorney, Agent, or Firm—Pollock, VandeSande & Priddy

[57] ABSTRACT

An alignment mark formed on a semiconductor wafer is disclosed. The mark comprises a mark member provided on a base region and a reflection changing portion provided on the mark member. The reflection changing portion has slightly inclined side walls.

2 Claims, 15 Drawing Figures

FIG_2
*PRIOR ART*
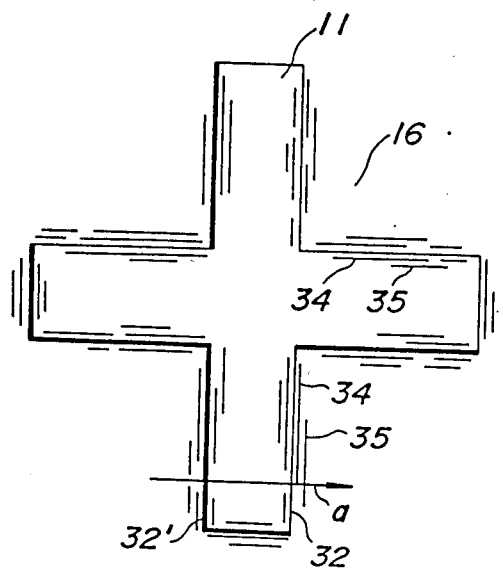
FIG_4
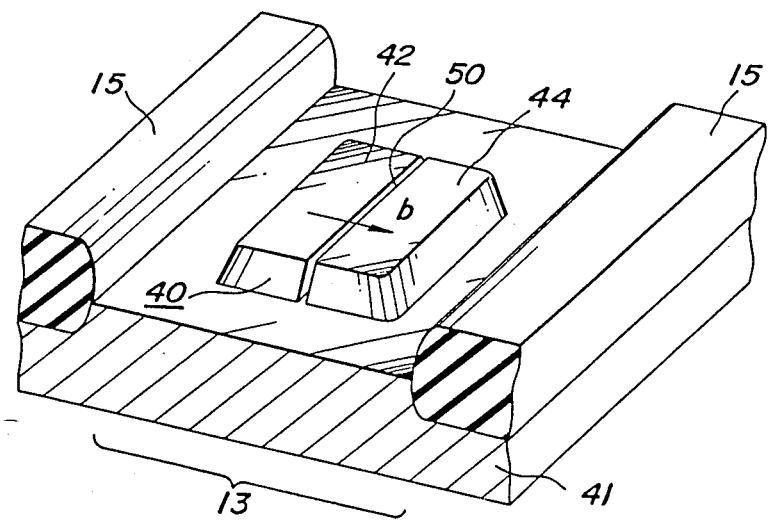

FIG_5a
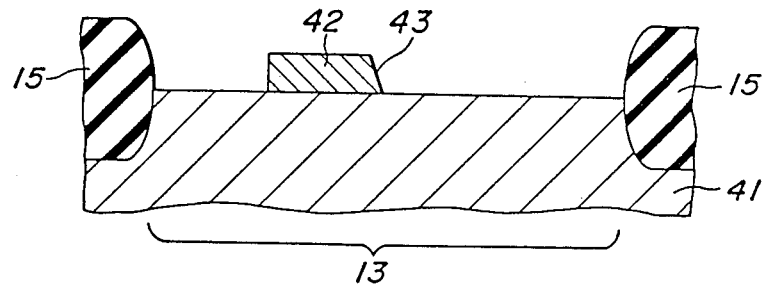
FIG_5b
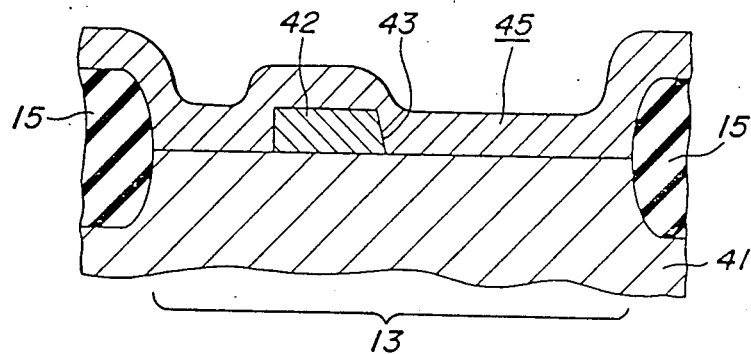
FIG_5c
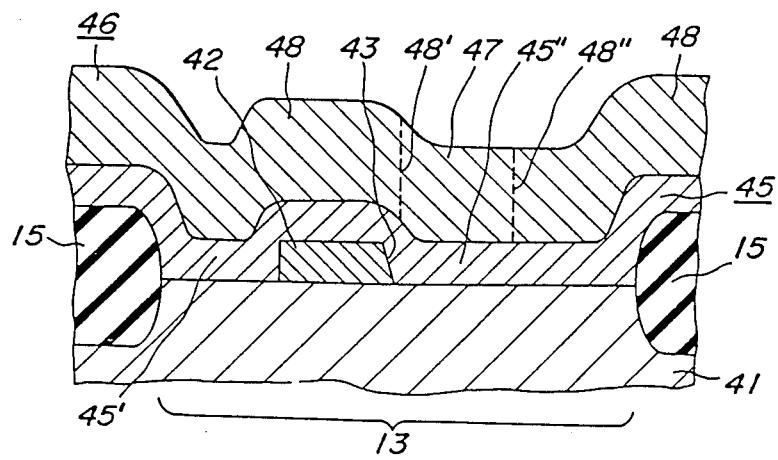

FIG_6
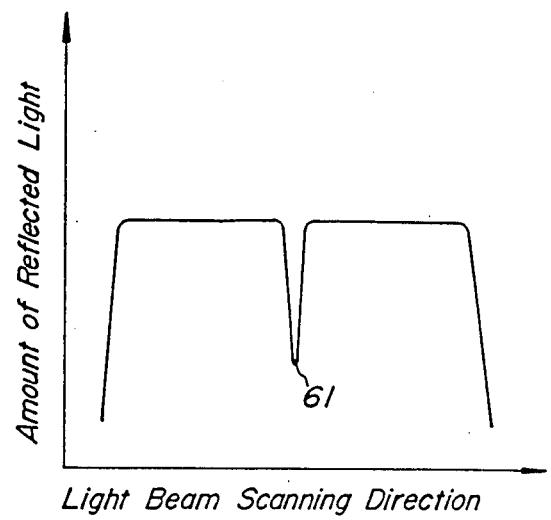
FIG_8
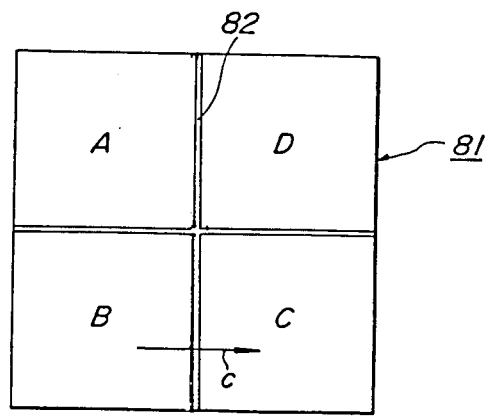

FIG_7a
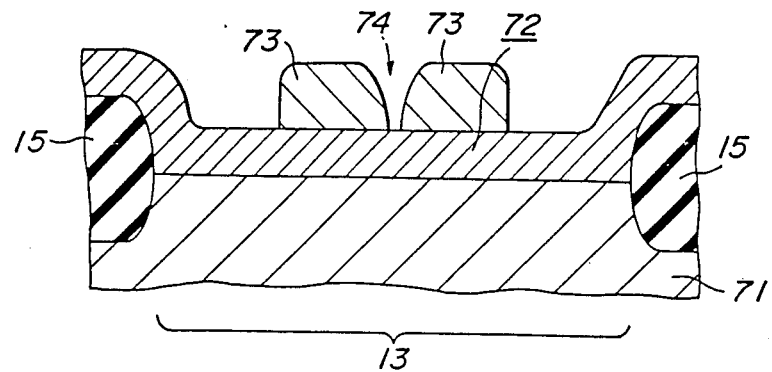
FIG_7b
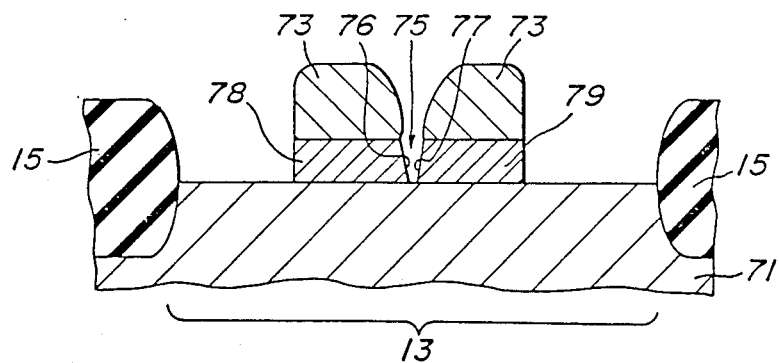
FIG_7c
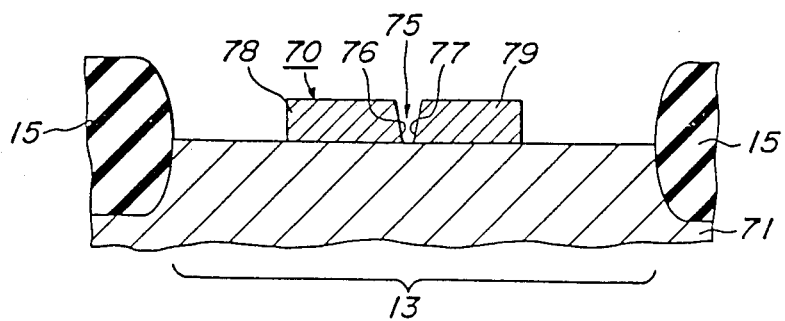

ALIGNMENT MARK ON A SEMICONDUCTOR AND A METHOD OF FORMING THE SAME

This is a division of application Ser. No. 619,960, filed June 12, 1984, abandoned.

BACKGROUND OF THE INVENTION

The present invention relates to an alignment mark on a semiconductor wafer capable of obtaining high alignment accuracy and a method of forming the same.

A photolithographic process is necessary to manufacture IC semiconductor devices. This process includes an alignment step which properly positions an alignment mark on the surface of a semiconductor wafer with the corresponding alignment mark on the surface of a photo mask on which IC patterns are depicted.

Recently, the alignment step is automatically performed by using an alignment and exposure apparatus with a photoelectric edge detector. A typical conventional engraved alignment mark is shown in FIG. 1. The alignment mark 11, for example, is formed by removing an oxide layer 16 on a semiconductor wafer 14 in a form of a cross having a width of 6 $\mu$m, and generally placed in a grid line 13 between semiconductor chip regions 15.

In the alignment step, the alignment and exposure apparatus places a photo mask (not shown) over the semiconductor wafer 14, roughly registers the alignment mark on the photo mask with the corresponding alignment mark 11 on the semiconductor wafer 14, scans the surface of a thick photo-resist layer (not shown) on the alignment mark 11 with light (ultraviolet rays) through the alignment mark of the photo mask in the direction of the arrow a, receives the two beams of light reflected from and near the edges 12 and 17 of the alignment mark 11 by its edge detector, calculates with the output signal from the edge detector the relative position between the alignment mark of the semiconductor wafer 14 and that of the photo mask, and adjusts the position between the wafer 14 and the photo mask according to the calculated output data.

In general, these steps are repeated several times until the alignment mark of the wafer 14 is coaxially symmetrically interposed in the middle of the alignment mark of the photo mask.

FIG. 2 shows a reflected light strength distribution on the surface of the alignment mark 11 obtained by the edge detector. In FIG. 2, for example, a thick line 32' shows a small amount of light reflected from the edge 12 shown in FIG. 1 and a thin line 32 a large amount of light reflected from the edge 17 shown in FIG. 1. FIG. 2 also shows double or triple interference fringes 34 or 35 which disturb accurate detecting operation of the edge detector.

In light scanning, the edge detector generates two peak signals as shown in FIG. 3. The negative or minus peaks 21 and 22 correspond to the edges 12 and 17 of the mark 11, respectively. The slopes 23 and 24 also show the levels of light reflected from and near the edge of the alignment mark on the photo mask.

The edge detector generates two pulses having the same amplitude in normal conditions. However, in case either edge (for example, edge 17) of the alignment mark 11 reflects enough incident light without attenuating due to the surface condition of a sloped thick photo-resist layer formed on the edge 17 of the alignment mark 11, the edge detector often generates a small pulse 22 as shown in FIG. 3. If two beams of reflected light are extremely different in light amount from each other, the edge detector generates wrong data to adjust the relative position between the photo mask and the semiconductor wafer 14. The difference between light levels received by the edge detector makes an alignment and exposure apparatus erroneously operate.

Therefore, with a conventional alignment mark, it has been difficult for an alignment and exposure apparatus to perform a high accurate alignment operation.

SUMMARY OF THE INVENTION

It is an object of the present invention to overcome the above disadvantages of conventional alignment mark.

It is another object of the present invention to provide an alignment mark capable of registering a semiconductor wafer and a photo mask with high alignment accuracy. An alignment mark according to this invention characterizes that the width between two edges of the mark residing in a scanning direction is so narrow that an edge detector cannot resolve the two reflected light beams from the two edges, respectively, upon a single scanning operation, thereby generating only one reflected light pulse signal from the edge detector.

According to the present invention there is provided an alignment mark comprising a mark member provided on a base region and a reflection changing portion provided on the said mark member and having slightly inclined side walls.

According to the present invention there is provided a method of forming an alignment mark comprising steps of providing first island on a base region, providing a film intended as second island on the base region and the first island, applying a photo resist film on the film, selectively exposing the photo resist film by light to form an unexposed portion and an exposed portion, subjecting the thus formed structure to a development treatment and to etching treatment by using the unexposed resist portion as a mask, thereby exposing the surface of the first island and forming an elongated slit.

According to the present invention there is also provided a method of forming an alignment mark comprising the step of providing a base region on a film to be etched, applying photo resist film on the film to be etched, subjecting the resist film to selective patterning process, subjecting the resist pattern to a development treatment to form first slit, subjecting the film to be etched to an etching treatment by using the first slit as a mask to form second slit, and removing the resist pattern film.

BRIEF DESCRIPTION OF THE DRAWING

These and other feature and advantages of the present invention will become readily apparent from the following detailed description of one embodiment of the present invention, particularly when taken in connection with the accompanying drawings wherein like reference numerals designate like or functionally equivalent parts throughout, and wherein;

FIG. 2 is a diagram showing strength difference of reflected light from the mark shown in FIG. 1;

FIG. 4 is a perspective view showing a construction of one embodiment of an alignment mark according to the present invention;

FIGS. 5a to 5e are sectional views illustrating steps of forming the alignment mark shown in FIG. 4;

FIG. 6 is a diagram illustrating strength difference of reflected light from the alignment mark according to the present invention;

FIGS. 7a to 7c are sectional views illustrating steps of forming another alignment mark according to the present invention;

FIG. 8 is a diagram explaining contrast of the alignment mark according to the present invention.

DESCRIPTION OF THE PREFERRED EMBODIMENT

Figure 1:
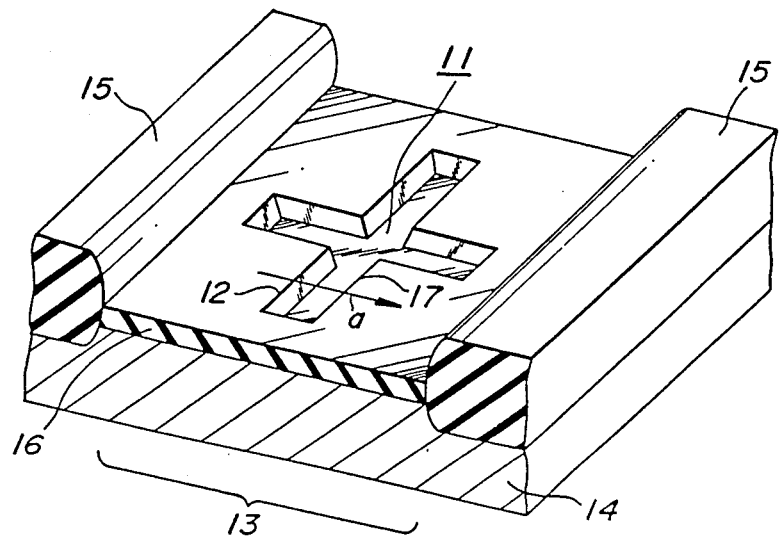
FIG. 1 is a perspective view showing a construction of conventional alignment mark.
Figure 3:
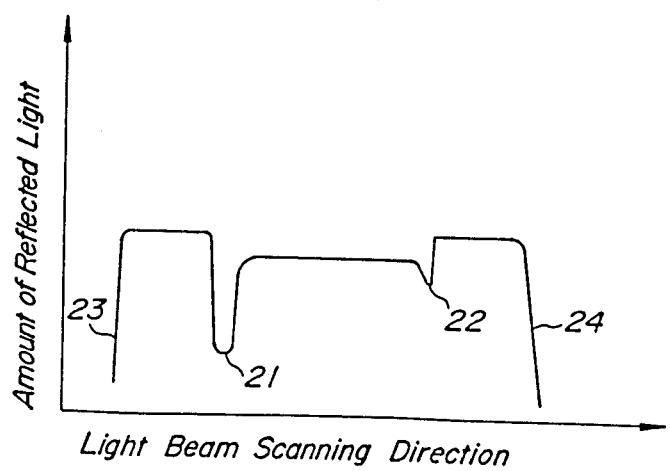
FIG. 3 is a diagram explaining the disadvantages of the conventional alignment mark.

Referring now to the drawings, there is shown an embodiment of an alignment mark according to the present invention.

FIG. 4 shows an alignment mark according to the present invention. Reference numeral 40 is a mark member or an alignment mark comprising a first film 42, a second film 44 and a slit 50. The other portions of the construction shown in FIG. 4 are the same as those shown in FIG. 1 so that the explanation thereof is omitted. The first film or island 42 may consist of polycrystalline silicon or phospho-silicate glass and the second film or island 44 may consist of phospho-silicate glass or polycrystalline silicon. The slit 50 has at most 1 μm and a V shaped cross-section. The first and second films 42 and 44 have a thickness of 1 μm. The slit 50 serves as a pattern of art mark for registering the alignment mark provided on the photo mask.

Figure 5D:
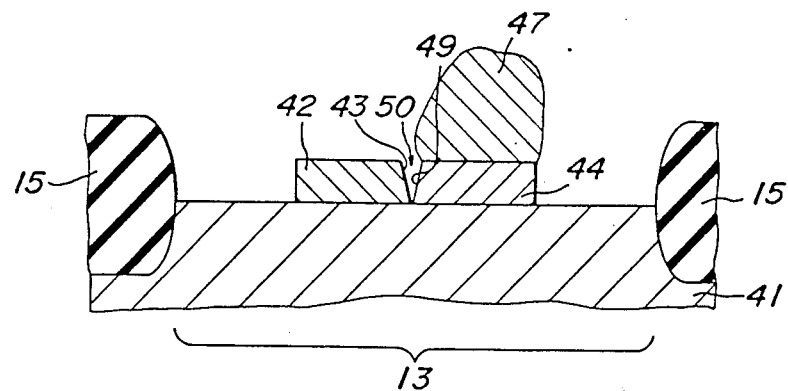

FIGS. 5a to 5e illustrate a method of forming alignment mark shown in FIG. 4. In this embodiment, as shown in FIG. 5a, a semiconductor wafer or substrate 41 having the grid line 13 is prepared, on which grid line 13 first film or island 42 consisting of for example, polycrystalline silicon is provided. The wafer 41 may consist of silicon material. Alternatively, the wafer 41 may be substituted for silicon oxide. Reference numeral 43 shows one edge of the mark to be formed.

As shown in FIG. 5b, a film 45 such as, for example, a phospho-silicate glass film is provided on the silicon substrate 41 and the polycrystalline film 42. Thereafter, as shown in FIG. 5c, a photo resist film 46 such as, for example, positive resist film is applied on the film 45. The photo resist film 46 is subjected to a photolithographic process to form an exposed portion 48 and an unexposed portion 47, the interface therebetween being shown by reference numerals 48' and 48''. In this case, the registration distance between an edge 43 of the film 42 and the edge 48' of the exposed region 48 is 1 μm or less.

Next, as shown in FIG. 5d, the thus formed structure is subjected to a development process thereby removing the exposed portion 48, and then, by using as a mask the residual resist portion 47, the portion 45' (FIG. 5c) of the film 45 placed on the first film 42 and the wafer 41 is removed by dry etching to expose the surface of the polycrystalline silicon film 42, while the portion 45'' (FIG. 5c) of the polycrystalline silicon film 45 placed under the mask 47 is remained as a second film or island 44, thereby forming a reflection changing portion or an elongated slit 50 having slightly inclined walls or edges 43 and 49, a width of 1 μm or less and substantially V or U shaped cross-section.

Figure 5E:
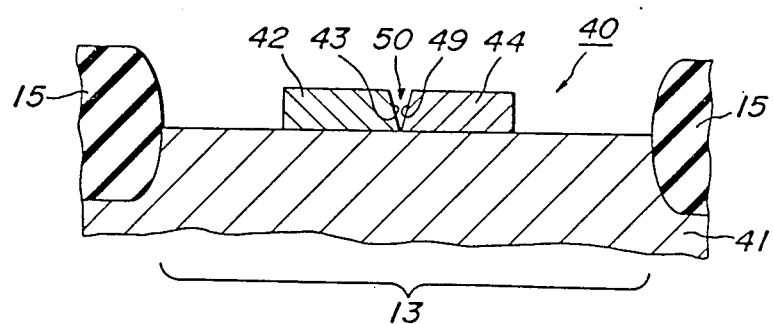

Finally, as shown in FIG. 5e, the residual etching resist film 47 is removed so that a mark member or mask alignment mark 40 having the slit 50 defined by both edges 43 and 49 is formed.

FIG. 6 shows one example of strength difference of the reflected light obtained by scanning the thus formed alignment mark in the direction of an arrow b (FIG. 4). In FIG. 6 the ordinate shows amount of the reflected light and the abscissa a light beam scanning direction. As the width of the thus obtained slit 50 is 1 μm or less, the weak reflected light from two edges 43 and 49 cannot be resolved as two weakest negative or minus peaks by the automatic mask aligner, so that as seen from FIG. 6, only one peak portion 61 being the weakest negative portion of strength of the reflected light is recognized as one line so that the position of the peak portion 61 can be detected as a position of the alignment mark as it is.

According to the present invention only one line can be detected as a pattern of alignment mark, so that the position of alignment mark may be determined without error caused by difference or interference fringes of contrast which is a conventional serious problem, resulting in a substantial improvement of registration or alignment precision.

Another method of forming an alignment mark according to the present invention is explained with reference to FIGS. 7a to 7c. In this embodiment, the alignment mark is formed by the mark member of same material on the grid line provided on the semiconductor wafer. As shown in FIG. 7a, a semiconductor wafer or substrate 71 having the grid line 13 is, at first prepared, on whole surface of which grid line 13 a film 72 to be etched is provided for defining the alignment mark 70. In this case, the film 72 consists of phospho-silicate glass or polycrystalline silicon. A photo resist film 73 is applied on the portion of the film 72 intended as the mark member, the resist film 73 is provided with a slit 74 having a width of 1 μm or less by selective patterning process, and then the resist pattern is subjected to a development process.

Then, as shown in FIG. 7b, the film 72 is subjected to an etching process to a depth attained to the wafer 71 by using the resist pattern 73 with the slit 74 as a mask, thereby forming the mark member with a reflecting changing portion or a slit 75 having a V shaped cross-section. Reference numerals 76 and 77 are slightly inclined walls or first and second edges (corresponding to first edge 43 and second edge 49 shown in FIG. 5) of first and second film or islands 78 and 79 which define the slit 75.

Finally, as shown in FIG. 7c, the resist pattern of the film 73 is removed so that the mask member or the alignment mark 70 having the slit 75 is obtained. In this embodiment the alignment mark thus obtained can be recognized or detected as one line having high contrast and a width of about 1 μm.

FIG. 8 shows one example of an alignment mark 81 having a cross slit pattern 82 formed by the above method shown in FIG. 5 or 7. In this case the slit has a width of 1 μm or less. The first film or island is portions A and C and the second film or island is portions B and D. The light image obtained by scanning light beam in the direction of an arrow c can also be recognized or detected as one line having high and stable contrast.

Figure 9:
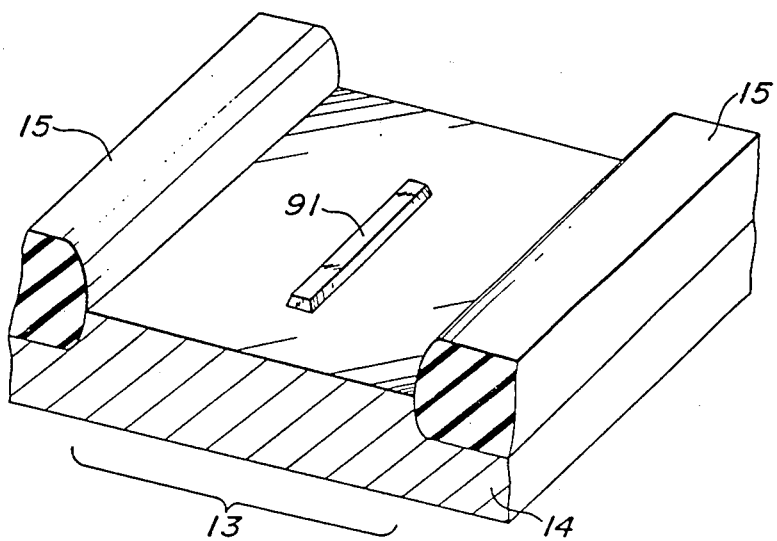
FIG. 9 is a perspective view showing a construction of alternative embodiment of the alignment mark according to the present invention.

FIG. 9 shows an alternate of the mask member or the alignment mark shown in FIG. 4. In this embodiment, the mark consists of an elongated projection or strip 91 and the reflection changing member is an upper surface portion of the strip 91. The other constructions are the same as those shown in FIG. 4 so that the explanation thereof is omitted. The strip 91 consists of phospho-silicate glass or polycrystalline silicon and has a width of about 1 $\mu$m or less and a height of about 0.3 $\mu$m.

According to the present invention as described above, the position of alignment mark can be detected as one line so that the time required for alignment working may be decreased.

What is claimed is:

1. A method of forming an alignment mark for registering a semiconductor wafer, said wafer being registered by scanning an incident light across the alignment mark, the method comprising the steps of:

preparing a semiconductor substrate;

providing on the surface of the semiconductor substrate a grid line region to serve as a section for dividing the semiconductor wafer into a plurality of chips;

providing a first island region of polycrystalline silicon on the grid line region;

providing a film of phospho-silicate glass on the surfaces of the first island region and the semiconductor substrate;

subjecting the phospho-silicate glass film to photolithographic etching for forming a second island region adjacent to the first island region, thereby forming an elongated slit having a width of 1 $\mu$m or less between the first and second island regions, said elongated slit serving as the alignment mark by reflecting as only one peak the incident light scanning thereacross.

2. A method as claimed in claim 1, wherein the first and second island regions have a width of about 1 $\mu$m and a height of about 0.3 $\mu$m.

* * * * *